(12) United States Patent
Deisenhofer et al.

(10) Patent No.: US 7,161,796 B2
(45) Date of Patent: Jan. 9, 2007

(54) SURFACE-MOUNTABLE COMPONENT AND METHOD FOR THE PRODUCTION THEREOF

(75) Inventors: Ralf Deisenhofer, Senden (DE); Dieter Hahn, Heidenheim (DE); Stephan Neumeister, Heidenheim (DE)

(73) Assignee: Kemet Electronics Corporation, Greenville, SC (US)

( * ) Notice: Subject to any disclaimer, the term of this patent is extended or adjusted under 35 U.S.C. 154(b) by 0 days.

(21) Appl. No.: 10/522,214

(22) PCT Filed: Jul. 18, 2003

(86) PCT No.: PCT/DE03/02432

§ 371 (c)(1),
(2), (4) Date: Jan. 14, 2005

(87) PCT Pub. No.: WO2004/010756

PCT Pub. Date: Jan. 29, 2004

(65) Prior Publication Data

US 2005/0254196 A1    Nov. 17, 2005

(30) Foreign Application Priority Data

Jul. 18, 2002  (DE) ................. 102 32 787
Sep. 25, 2002  (DE) ................. 102 44 713

(51) Int. Cl.
*H01G 4/228*  (2006.01)
*H01G 9/00*   (2006.01)
*H01G 5/38*   (2006.01)

(52) U.S. Cl. ............ 361/540; 361/541; 361/528; 29/25.42

(58) Field of Classification Search ........ 361/328–329, 361/541, 522, 523, 528–529, 532–533, 535–540
See application file for complete search history.

(56) References Cited

U.S. PATENT DOCUMENTS

| | | | |
|---|---|---|---|
| 3,686,535 A | 8/1972 | Piper | |
| 5,343,075 A | 8/1994 | Nishino | |
| 5,519,581 A * | 5/1996 | Liepe | 361/782 |
| 6,081,418 A | 6/2000 | Kuranuki et al. | |
| 6,285,067 B1 | 9/2001 | Hyoudo et al. | |
| 6,399,420 B1 | 6/2002 | Cha et al. | |
| 6,493,213 B1 | 12/2002 | Clasen et al. | |
| 6,661,645 B1 * | 12/2003 | Sakai et al. | 361/523 |
| 2002/0076484 A1 | 6/2002 | Lessner et al. | |

FOREIGN PATENT DOCUMENTS

| | | |
|---|---|---|
| DE | 199 20 445 | 11/1999 |
| DE | 101 31 236 | 1/2003 |
| DE | 199 41 094 | 7/2003 |
| EP | 1 215-691 | 6/2002 |
| JP | 01109711 | 4/1989 |
| JP | 5-13666 | 1/1993 |
| JP | 08017679 | 1/1996 |
| JP | 2001102793 | 4/2001 |
| JP | 2002280263 | 9/2002 |
| WO | WO00/74091 | * 12/2000 |
| WO | WO01/16973 | 3/2001 |
| WO | WO03/003394 | 1/2003 |

* cited by examiner

*Primary Examiner*—Eric W. Thomas
(74) *Attorney, Agent, or Firm*—John B. Hardaway, III; Nexsen Pruet, LLC

(57) ABSTRACT

A surface-mounted component includes an external contact, and components that are arranged in proximity to each other and that contain terminals. The external contact is connected to the terminals by spot welds. The external contact defines a contact surface on an assembly area of the surface-mounted component. The external contact also has an area that is free of spot welds.

19 Claims, 4 Drawing Sheets

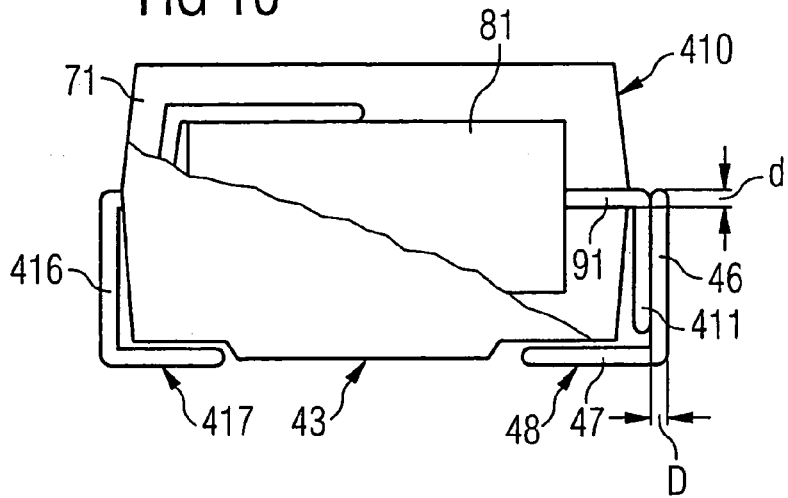
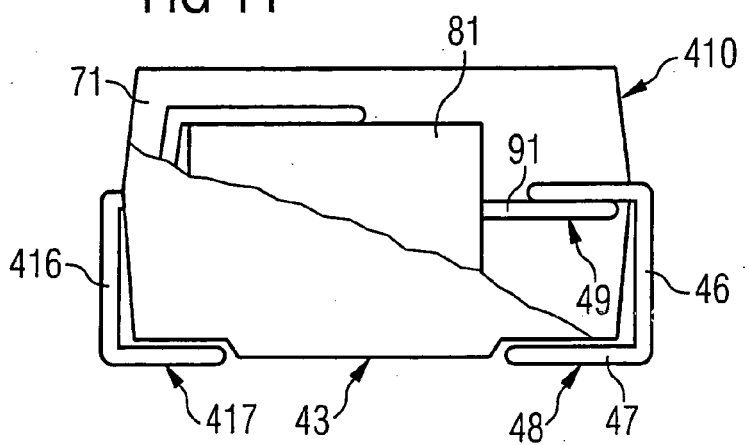
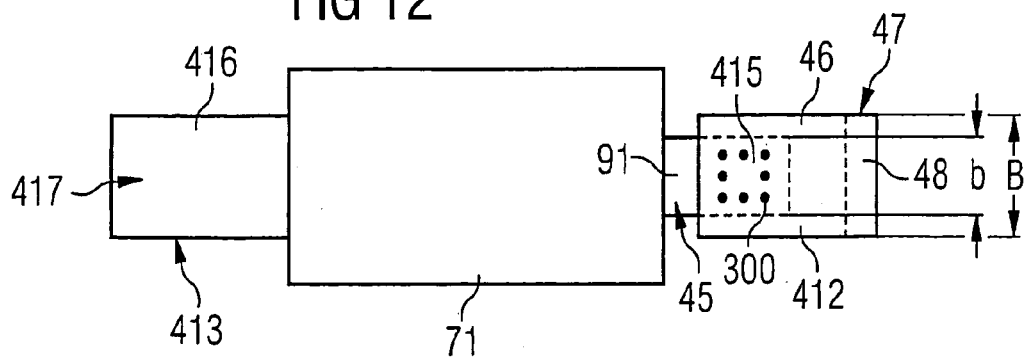

SURFACE-MOUNTABLE COMPONENT AND METHOD FOR THE PRODUCTION THEREOF

TECHNICAL FIELD

The invention relates to a surface-mountable component having individual components and an external connection. Furthermore, the invention relates to a method for manufacturing the surface-mountable component.

BACKGROUND

Surface-mountable components that are tantalum electrolytic capacitors are known from publication WO 01/16973 A1. These surface-mountable components have the disadvantage that they demonstrate an equivalent series resistance, also known under the name electrical series resistance (ESR), which is too high for many requirements.

One attempt at solving this problem requires connecting a plurality of individual components together in parallel within one surface-mountable component, the separate capacitors being surrounded by a common housing. One such component is known from U.S. Pat. No. 3,685,535. The parallel connection of individual capacitors within one single common housing has the disadvantage that production costs are high, because connecting in parallel is performed approximately at the time when the manufacturing process is half complete. Additional manufacturing steps are necessary after the parallel connections have been made. If an individual capacitor breaks down in one of these subsequent steps, the entire component will become unusable, leading to a higher rejection rate.

The object of the present invention is therefore to provide a surface-mountable component comprising of individual components solidly stacked together that may be manufactured with a low rejection rate and is particularly easy to mount, on a circuit board for example.

This object is achieved with a surface-mountable component as recited in claim 1. Other embodiments of the component and a method for its manufacture may be derived from the other claims.

A surface-mountable component that demonstrates at least one external connection shall be provided. The component moreover demonstrates individual components, which are stacked together and contain the individual terminals. Spot welds connect the external connection to a plurality of individual terminals. The external connection forms a contact surface on the assembly side of the component, an area that is free of spot welds being provided on the external connection for later wetting with solder.

The surface-mountable component has the advantage that the individual components are connected to their individual terminals with the aid of the external connection. The connection of the individual components accordingly thus takes place externally, after the particular individual component has been produced. Since spot welds connect the external connection to the individual terminals, a particularly solid, corrosion-resistant electrical connection between the external connection and the individual terminals results. An area that is free of spot welds is provided on the external connection for later wetting with solder, making it particularly easy to solder the component according to invention to a circuit board, for example. In general, spot welds have the property that they cannot be wetted with solder very well.

The term "individual terminals" is intended to mean in particular connecting terminals of the individual components that are arranged on the outside of the individual components. Since a contact surface is formed on the assembly side of the component with the aid of the external connection, a surface-mountable component may be realized in a simple way and manner.

The stacking of the individual components together furthermore has the advantage that a space-saving construction of the individual components can be achieved.

In one embodiment of the component, the external connection is designed L-shaped. One leg of the L forms the contact surface. Here it is particularly advantageous for that leg of the L that forms the contact surface to be directed inwards. This achieves a particularly space-saving construction.

In one embodiment of the component, the external connection may be formed out of one of the individual terminals. This has the advantage of potentially dispensing with the processing of additional elements.

In another embodiment of the invention, individual terminals are located only on the inside of the external connection. This embodiment of the component has the advantage that an overlap of different contact elements or pins from the outside can be avoided, including from the assembly side and from the side faces of the component that adjoin the assembly side.

The surface-mountable component is preferably pressed into prepared soldering points or conductive adhesive on a printed circuit board and then wetted with solder on its contact surfaces by means of heat. Here the wetting of the solder may only occur at the contact surfaces on the assembly side of the component. Even more, it must still be possible to wet with solder to a certain minimum height across the circuit board at the external contacts of the component. Since the external contact doesn't have any overlap with other contact elements on its outside, a particularly advantageous good wettability with solder results here.

It is furthermore advantageous for each individual component to feature its own housing.

In another embodiment of the component, the external connection is a separate part that is connected to individual terminals. This embodiment has the advantage that the external connection may be used as a forming element when assembling the component.

SUMMARY

Accordingly, a method for manufacturing the component is given, wherein external connections are provided in a first processing step, wherein the position of the external connections delimits the external dimensions of the component to be manufactured. In the subsequent processing step, individual components, which each demonstrate individual terminals, are stacked together, namely inside the positioned external connections. The individual terminals of the individual components are connected to the external connection by welding, keeping free of spot welds an area of the external connection that is to be wetted with solder.

In one embodiment of the component, the external connection extends along a side face of the component. This fitting arrangement of the external connection ensures that the component demands little space in the lateral direction and may thus be used for a space-saving method of construction on a printed circuit board.

A connection by means of laser welding advantageously comes into consideration for connecting the external connection to the individual terminals through spot welds.

Besides laser welding, other welding methods may also be used for joining the external connection to the individual terminal. Connection by welding has the advantage that a reliable and solid connection may be created both electrically and physically.

In another embodiment of the component, individual components are stacked on top of each other. The base area of the bottom individual component thereby forms the assembly surface of the component. The individual terminals of the top individual component are advantageously bent downwards. The individual terminals of the remaining individual components may be bent upwards or downwards.

This embodiment has the advantage that the component advantageously demands as little space as possible for its height, namely in the stacking direction.

In another advantageous embodiment of the component, the components stacked on top of each other may be glued together with adhesive. This achieves the advantage of improving the physical strength of the component.

In a special embodiment of the component, one or a plurality of the individual components are capacitors that include a housing. Each housing is comprised of one anode body. One anode contact, which is conductively connected to the external connection, is brought out from each anode body. In this case, the anode contact may also be identical to an individual terminal, or a separate individual terminal may connect the anode contact to the external connection.

Such a component has the advantage that it represents a multiple capacitor, it thereby being possible to achieve a parallel connection of the separate capacitors in a simple way and manner. The electrical serial resistance can thereby be reduced in a simple way and manner.

In another embodiment of the component, a plurality of individual components, each demonstrating a housing, are provided. An electrical functional unit is arranged within each of these housings. Connector elements of the electrical functional units are brought out from each housing as individual terminals.

This embodiment of the component shows that the invention is not limited to capacitors, but may be used for a variety of different components.

In another embodiment of the component, a number of individual components are stacked on top of each another. A side face of the stack built in this manner forms the assembly surface.

This embodiment of the component has the advantage that the individual components may be advantageously used not only in an embodiment stacked on top of each other but also stacked next to each other. This is particularly advantageous in cases where the overall height of the component is critical and the individual components feature a large height. Here it is particularly advantageous not to stack the individual components on top of each other but rather next to each other.

In another embodiment of the component, two external connections are provided. The external connections connect the individual terminals of the individual components into a parallel connection of the individual components. This special embodiment of the component permits the realization of a capacitor comprising of a plurality of individual capacitors connected in parallel and thus exhibits a very low electrical serial resistance.

However, in a component according to invention, it is also possible to stack together individual components having different electrical functions from each other.

In the following, the invention will be explained in more detail based on exemplary embodiments and their associated figures:

Figure 1:
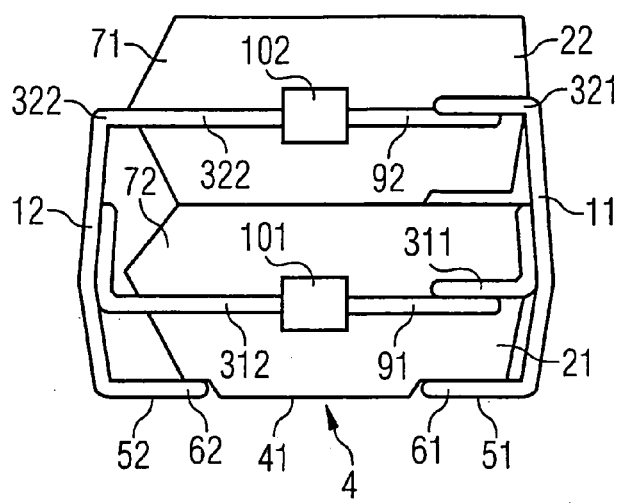
FIG. 1 shows a component in a schematic longitudinal section for sake of an example.

The same applies to FIGS. 3, 4, 5 and 6, wherein each figure only represents the right half of an embodiment corresponding to FIG. 1.

Figure 7:
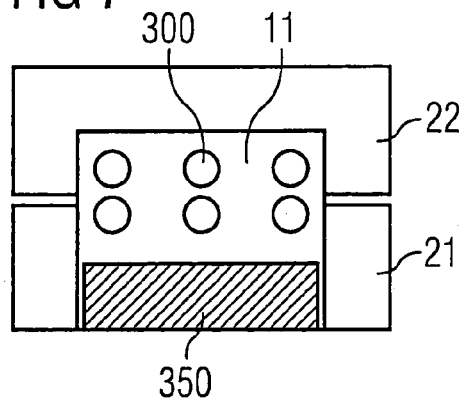

FIG. 7 shows a side view of a component, spot welds being arranged in two rows, one on top of the other.

Figure 8:
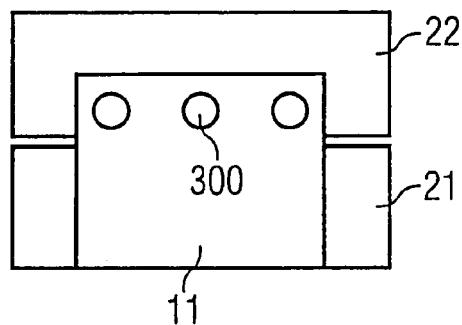

FIG. 8 shows a presentation corresponding to FIG. 7 wherein however only one row of spot welds is arranged.

Figure 9:
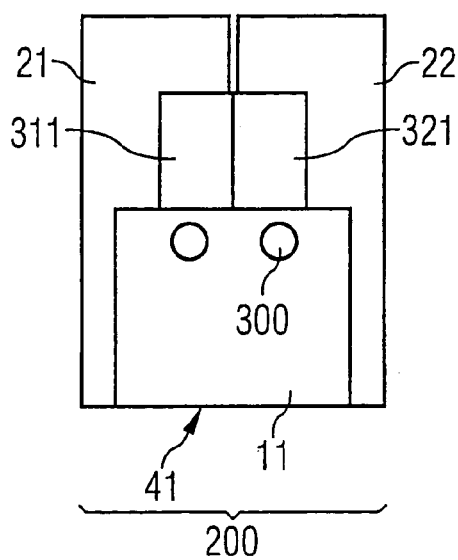

FIG. 9 shows the side view of another embodiment of a component, wherein the individual components lie edgewise and are thus stacked next to each other.

FIG. 10 shows a capacitor in a schematic cross section for sake of example.

FIG. 11 shows another capacitor in a schematic cross section for sake of example.

FIG. 12 shows a capacitor during manufacture in top view for sake of example.

DETAILED DESCRIPTION

FIG. 1 shows a component which is built out of two individual components 21, 22 arranged one above the other. But, the invention is not restricted to two individual components 21, 22 but may be built of a plurality of individual components stacked together on top of each other or next to each other. The individual components 21, 22 each have approximately the shape of a rectangular parallelepipedon. They are stacked with their flat sides on top of each other. The bottom flat side of the bottom individual component 21 forms the assembly side 4 of the component. A functional unit 101, 102 located inside a housing 71, 72, is provided within each of the individual components 21, 22. It is noted that the invention is not restricted to components in which the individual components demonstrate functional units surrounded by housings. It is rather also conceivable that functional units without housings are stacked together.

Individual terminals 322, 312, which are connected to the respective functional unit 101, 102, are provided on the left side of each functional unit 101, 102. At the same time, the individual terminal 322 of the top individual component 22 forms the external connection 12, which forms a contact surface 52 on the underside of the component. The external connection 12 electrically connects the individual terminal 322 to the individual component 312.

A presentation which may schematically relate to capacitors stacked on top of each other is chosen in the right half of FIG. 1 for sake of an example. Here the functional units 101, 102 would be anode bodies of tantalum capacitors. Each functional unit 101, 102 then includes an anode contact 91, 92, which may, for example, include a valve metal, such as niobium or tantalum. Each anode contact 91, 92 is connected to an individual terminal 321, 311, still within its respective housing 71, 72. This connection may be realized by gluing, soldering or welding for example.

A solderable material in particular comes into consideration as individual terminal 311, 321. In one advantageous embodiment of the component, the individual terminals 311, 321 may be designed as two-dimensional. They may for example have the shape of sheets or even of ribbons. The two-dimensional build of the external connections 321, 311 ensures a particularly large and therefore advantageous contact surface between individual terminals 311, 321 and the external contact 11.

In the example depicted in FIG. 1, the individual terminal 321 of the top individual component 22 forms the external contact 11 on the right side of the component. The external connection 11 is bent downwards in front of its point of exit from housing 71, contacts the individual terminal 311 of the bottom individual component 21 and is finally bent inwards on the underside of the stack. The external connection 11 forms the shape of an L, one leg 61 of the L forming a contact surface 51 on the assembly side 4 of the component. The external connections 11, 12 may demonstrate the shape of contact tracks, which preferably, but not necessarily, are made of the same material as the individual terminals 311, 312, 321, 322. In particular, nickel, steel or even copper and alloys come into consideration as materials.

FIG. 1 shows an embodiment of the component in which the individual terminals 311, 312 of the bottom component 21 are bent upwards.

Figure 2:
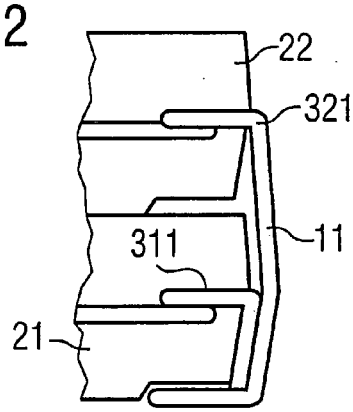
FIG. 2 shows another embodiment of the component corresponding to FIG. 1 wherein only the right half is presented.

FIG. 2 shows an embodiment of the component corresponding to FIG. 1, but with the difference that the individual terminal 311 is bent downwards at its point of exit from the housing of individual component 21. It runs on the inside of the external connection 11 just as in FIG. 1, so that overlapping of terminals on the outside of external connection 11 can be avoided.

Figure 3:
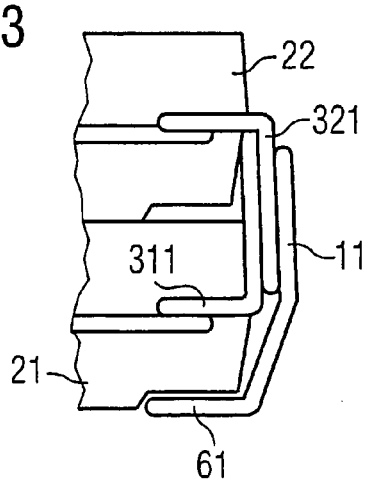

FIG. 3 shows an embodiment corresponding to FIG. 2, but with the difference that the external connection 11 is a separate part. The external connection 11 contacts the individual terminal 321, which for its part again contacts the individual terminal 311 of the bottom individual component 21. The external connection 11 demonstrates approximately the shape of an L, one leg 61 of the L forming a contact surface on the underside of the component. The individual terminal 321 of the top individual component 22 is bent downwards. The individual terminal 311 of the bottom individual component 21 is bent upwards. The length of the individual terminals 311, 321 is chosen so that the individual terminals 311, 321 overlap. This permits mutual contacting of the individual terminals 311, 321 without trouble. In their overlap region, the individual terminals 311, 321 are yet overlapped by the external connection 11, so that all three contact elements 321, 311, 11 are in mutual electrical and physical contact with each other.

Figure 4:
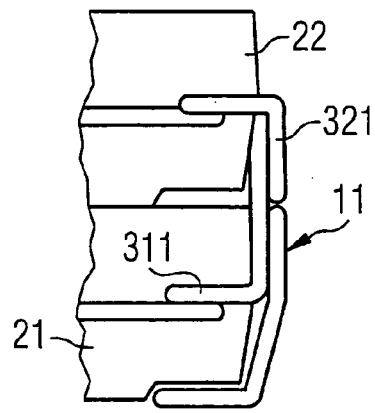

FIG. 4 shows an embodiment corresponding to FIG. 3 but in which, in contrast to FIG. 3, the individual terminal 311 provides the contact between the individual terminal 321 and the external connection 11. In this method of construction, a joint between the external connection 11 and the individual terminal 321 is located approximately in the center between the two individual components 21, 22. In contrast to FIG. 3, the external connection 11 does not overlap the overlap region of the individual terminals 321, 311. But the external connection 11 does overlap the individual terminal 311. The individual terminal 311 for its part overlaps the individual terminal 321.

Figure 5:
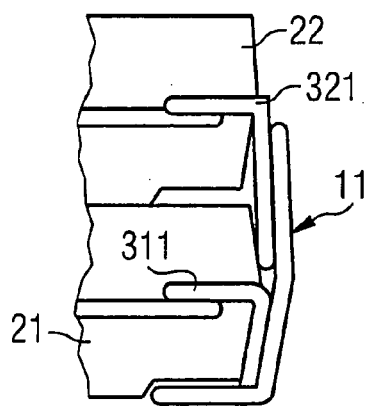

FIG. 5 shows an embodiment corresponding to FIG. 3, but with the difference that the individual terminal 311 is bent downwards rather than upwards. Accordingly, the length of individual terminal 311 is designed somewhat shorter than in FIG. 3. The embodiment in accordance with FIG. 5 has the advantage over the embodiment of FIG. 3 that the width of the component is somewhat reduced, which can be a big advantage when space requirements are critical.

Figure 6:
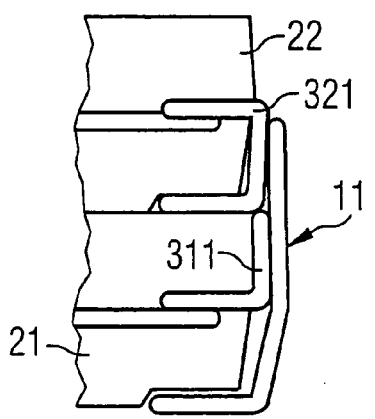

FIG. 6 shows an embodiment corresponding to FIG. 4, but with the difference that the external connection 321 is not bent only down, but is yet bent inwards at another folding point in the space between the individual components 21, 22. This structural shape arises when one individual component, which for its part already demonstrates the property of surface-mountability, is used as the second individual component 22. This case namely requires that a contact surface be provided on the underside of individual component 22, the individual terminal 321 forming the contact surface in this case. In FIG. 6, the external contact 11, which overlaps the two individual terminals 311, 321, provides the electrical contact between the individual terminals 311 and 321. But the individual terminals 311, 321 do not overlap each other, a feature that is advantageous in regard to the width of the component.

FIG. 7 shows a side view of a component wherein two individual components 21, 22 are stacked one on top of the other. Spot welds 300 connect the individual terminal 11 to the individual terminals of the individual components 21, 22. The spot welds 300 are arranged in two rows one on top of the other. The fitting arrangement of individual terminals in relation to the arrangement of individual components 21, 22 is chosen in such a manner that the area 350 of the external connection 11 to be wetted, which extends from the underside of the component up to a certain height, half the height of the bottom individual component 21 for example, is free of spot welds 300.

FIG. 8 shows another embodiment corresponding to FIG. 7, with the difference that the individual terminals of the individual components 21, 22 are so designed that the spot welds 300 are only present in a single row.

FIG. 9 shows another embodiment in a side view corresponding to FIG. 7, with the difference that the individual components 21, 22 are stacked next to each other. The individual terminals 311, 312 are brought out of the individual components 21, 22 laterally and connected to the mutual external connection 11. The connection is accomplished through spot welds 300. The stack 200 formed by the individual components 21, 22 thus extends in the lateral direction. Starting from approximately half of the height of the individual components 21, 22, the external connection 11 is pulled toward the underside, where it forms an external contact with an L-shaped section projecting inwards (not shown in FIG. 9). In the case of FIG. 9, a side face of the stack 200, rather than the base area of one of the individual components 21, 22, forms the assembly surface 41 of the component.

Let it be pointed out that the present component may be particularly advantageously used as a stack of capacitors located one above the other, especially solid electrolytic capacitors. Capacitors whose anode bodies feature a two-dimensional or even a round, wire-shaped contact come into consideration for this. For example, the use of individual capacitors, as they are known from the publication WO 01/16973 A1, the full content of whose disclosure we explicitly refer to here, comes into consideration. This publication describes solid electrolytic capacitors that demonstrate a two-dimensional anode contact. Moreover, the use of solid electrolytic capacitors whose anode contact is a wire-shaped contact also comes into consideration, however.

In the following, we will describe embodiments of solid electrolytic capacitors that may advantageously be used for the present component:

Let us indicate a capacitor that demonstrates an anode body that is surrounded by a housing having a base area. An anode contact is brought out from the inside of the anode body. The anode contact is welded to an anode terminal. The anode terminal features a soft-solderable material on its surface. A section of the anode terminal that runs along the base area of the housing forms a soldering surface there.

The capacitor has the advantage that the soldering surface on the base area of the housing is not formed by the anode contact brought out from the anode body, but by an anode terminal featuring a solderable surface. The step of making the anode contact solderable may be dispensed with.

As a material for the anode contact, such materials that contain refractory metals in particular come into consideration. Examples of refractory metals are titanium, zirconium, hafnium, tantalum, niobium, vanadium, tungsten and molybdenum. These refractory metals are in principle suitable for manufacturing solid electrolytic capacitors, as they have already been manufactured as tantalum electrolytic capacitors for example or also as niobium electrolytic capacitors. But alloys of these refractory metals also come into consideration as material for the anode contact.

Moreover, the anode contact may contain a non-solderable material, such as zirconium, tantalum, niobium, molybdenum or tungsten for example. Solderability of the anode contact is then no longer required due to the weld joint between the anode contact and the anode terminal.

In one embodiment of the capacitor, an end section of the anode contact located within the housing is welded to an anode terminal. The anode terminal exits from a front face of the housing and, at its point of exit from the housing, is bent toward the base area of the housing. The anode terminal is once again bent inwards at the base area itself, so that it forms a soldering surface there.

This embodiment of the capacitor has the advantage that the anode contact already terminates within the housing and only very little material is thus consumed for the anode contact. Since tantalum is used for the anode contact in many cases, this results in an economic advantage.

In another embodiment of the capacitor, the anode contact exits the housing from a front face of the housing. A section of the anode contact located outside the housing is welded to an anode terminal and bent toward the base area of the housing. The anode terminal continues the anode contact in the direction of the base area and is bent inwards at the base area to form a soldering surface on the base area.

The anode contact may exit the front face of the housing at approximately half of its height and be bent toward the base area of the housing. Such an anode contact has the advantage that, in addition to the soldering surface arranged on the base area of the base body, the capacitor is also solderable in a section extending along the front face of the housing away from the base area toward the point of exit of the anode contact from the housing. Various standards require such a solderability of the side lug of the anode contact. Standard IEC 60068-2-58, for example, requires wettability with solder over at least 95% of the common terminal-lug surface. A US publication IPC/EIA J-STD-002A merely requires that the portion of the anode contact located on the front face of the housing be wettable across the depth of the anode contact.

Moreover, it is advantageous for the anode terminal and anode contact to demonstrate the shape of a strip running in a longitudinal direction, wherein the width of the anode terminal may be different from the width of the anode contact. Anode terminal and anode contact in the shape of a strip running in a longitudinal direction are particularly easy to manufacture, in the form of sheets for example.

A strip-shaped anode contact additionally has the advantage that the anode body may be attached to the anode contact by the silk screen printing of a paste.

The strip shape for the anode terminal is advantageous, because a solid weld joint may be produced by the two-dimensional superimposition of the anode contact and anode terminal. By choosing different widths for the anode terminal and anode contact, it is possible to adapt the appropriate width of the anode contact for particular predetermined electrical properties of the capacitor to housing standards for the soldering surface by choosing a suitable width for the anode terminal.

In particular, it is advantageous for the width of the anode contact to be smaller than the width of the anode terminal. This method succeeds in adapting narrow anode contacts to the widths that the standards require for the soldering surfaces on the underside of the housing, this adaptation being necessary for capacitors with certain electrical properties.

The anode terminal may be made soft-solderable by having nickel, cobalt, tin, lead, a precious metal or steel present on its surface. It is also possible to achieve solderability of the anode terminal through an alloy of the metals cited.

The welding of the anode contact to the anode terminal, which may resemble the external connection, can be advantageously produced by having the anode contact and anode terminal overlap one another and by placing, on the overlap surface, spot welds that delimit the area. This ensures a two-dimensional and correspondingly solid fastening of the anode terminal to the anode contact.

For smaller structural shapes of the capacitor in contrast, it is advantageous for spatial reasons to weld the anode contact to the anode terminal using only a singe spot weld.

FIG. 10 shows a capacitor having an anode body 81, which is surrounded by a housing 71. The anode body 81 may for example be made of a porous sintered compact comprising of tantalum or niobium powder. The housing 71 may for example be made out of an injection-moldable plastic. An anode contact 91, which exits from a front face 410 of the housing 71, is brought out from the anode body 81. At its point of exit from the housing 71, this anode contact 91 is bent in the direction of the base area 43 of the housing 71. An anode terminal 46 is welded to a section 411 of the anode contact 91. Whereas the anode contact 91 preferably consists of material corresponding to the anode body 81, such as tantalum or niobium, a material that can be joined through soft soldering is selected for the anode terminal 46.

The anode terminal 46 corresponds to the individual terminals 311, 321 of FIGS. 1 through 9.

Besides the materials copper, nickel, iron, precious metals, cobalt or steel or alloys thereof, a nickel/iron alloy, especially a 42NiFe alloy that demonstrates a partial coating with nickel, copper, tin and silver comes into consideration for this. Such materials are usually used for system carriers. The capacitor according to invention may accordingly be economically manufactured in large scale by using system carriers for both the anode contact 91 and a cathode contact 416.

The anode terminal 46 made of soft-solderable material has the advantage that a soldering surface 48 may be formed on the base area 43 of the housing 71 by bending the anode terminal 46 and thereby forming a section 47 of the anode terminal 46. A cathode contact 416, which is bent around the housing 71 in a manner corresponding to that of the anode terminal 46, is attached to the cathode attached to the anode body 81, so that another soldering surface 417, with the aid of which the cathode of the capacitor may be soldered to a printed circuit board, appears on the base are 43 of housing 71.

By providing a soldering surface 48 and/or another soldering surface 417 on the base area 43 of housing 71, there arises a capacitor in chip structure, as is particularly suitable for use in conjunction with a surface-mounted device technique.

In the example depicted in FIG. 10, the thickness d of the anode contact 91 is approximately 0.075 mm. The thickness D of the anode terminal 46 is approximately 0.1 mm. In comparison to the example from FIG. 11, the capacitor shown in FIG. 10 has the advantage that welding between the anode contact 91 and anode terminal 46 only requires a capacitor whose width is the sum of d and D, making it possible to achieve maximum efficiency of the housing 71 in the lateral direction and thus realize higher capacities for the same housing size.

FIG. 11 shows another embodiment of the capacitor wherein an end section 49 of anode contact 91 located within the housing 71 is welded two-dimensionally to an anode terminal 46. The welding may be performed by laser welding for example.

The anode terminal 46 exits the housing at a front face 410 of the housing 71 and is bent there toward the base area 43 of housing 71. The anode terminal 46 is bent inwards once more at the edge between the front face 410 and the base area 43 of the housing, so that a soldering surface 48, formed by an end section of the anode terminal 46, is created on the base area 43 of the housing 71.

The embodiment of the invention shown in FIG. 11 does have a less efficient housing than the embodiment shown in FIG. 1, but it does have the advantage that the anode contact 91 may be made shorter, thereby saving the relatively expensive tantalum or niobium material that is usually used for the anode contact 91.

FIG. 12 shows a capacitor in conformity with the embodiment depicted in FIG. 10 during its manufacture. The anode body 81 is already sheathed by the housing 71. The cathode contact 416 and anode contact 91 exit the housing on the left side of both front faces of the housing 71. The anode contact 91 and the anode terminal 46 are in the form of strips extending in the longitudinal direction. The anode contact 91 thus demonstrates a flat side 45. The anode contact 91 and anode terminal 46 overlap each other in the dashed region. The welding between anode contact 91 and anode terminal 46 is performed through spot welds 300, which delimit an area 415. A solid connection between the anode contact 91 and anode terminal 46 may thereby be achieved. The width b of anode contact 91 may be adapted to a width B of a soldering surface by appropriate choice of the width B of the anode terminal 46, width B being larger to meet the requirements of standards. The anode terminal 46 also demonstrates a flat side 412. The two flat sides 412, 45 of anode contact 91 and anode terminal 46 overlap each other.

At its end, the anode terminal 46 demonstrates a section 47 that, after the anode terminal 46 has been bent around the housing 71, comes to rest on the underside of housing 71 where it forms a soldering surface 48. The cathode contact 416 is correspondingly bent around the housing 71 and forms another soldering surface 417 on the underside of housing 71.

The capacitor may be made with any material that forms a suitable porous sintered compact and is not restricted to tantalum or niobium.

The manufacture of the capacitor may proceed as follows, for example:

The anode body 81 is made available with a brought-out anode contact 91. The anode contact 91 is welded to an anode terminal 46. In addition, the anode body 81 is electrically connected to a cathode contact 416. Cathode contact 416 and anode terminal 46 are made available for a plurality of capacitors as components of a system carrier. The system carrier provides cathode contact 416 and anode terminal 46 with the appropriate dimensions so that it only remains necessary to install the anode body 81 and the anode contact 91 into the system carrier. After the anode contact 91 has been welded to the anode terminal 46, the anode body 81 is sheathed by a plastic housing. The cathode contact 416 and anode terminal 46 are then bent around the housing to the base area 43 of the housing 71. There they form a first and second soldering surface 48, 417.

A plurality of anode bodies 81 may also be installed into the system carrier and be separated after being sheathed by the housing 71. The bending of anode contact 46 and cathode contact 416 follows the separating.

The present invention is not limited to a parallel connection of capacitors, but may be used with a plurality of different components, such as resistors, inductance coils or all other possible electrical components that are supposed to be implemented as surface-mountable components.

In particular, it is also conceivable to combine various components together, using within the component for example a capacitor and a resistor connected in parallel or a capacitor and an inductance coil connected in parallel, to realize a resonating circuit.

The invention claimed is:

1. A surface-mounted component, comprising:
    an external contact; and
    components that are arranged in proximity to each other, the components comprising terminals;
    wherein the external contact is connected to at least one of the terminals by one or more spot welds;
    wherein the external contact defines a contact surface on an assembly area of the surface-mounted component;
    wherein the external contact comprises an area that is free of spot welds; and
    wherein at least part of each of the terminals extends along a side of the surface-mounted component.

2. The surface-mounted component of claim 1, wherein the external contact is L-shaped and comprises a leg, the leg defining the contact surface.

3. The surface-mounted component of claim 1, wherein the external contact comprises the terminals.

4. The surface-mounted component of claim 1, wherein at least part of each terminal is inside one of the components.

5. The surface-mounted component of claim 1, wherein the external contact and the terminals comprise separate parts of the surface-mounted component.

6. The surface-mounted component of claim 1, wherein the components are stacked vertically;
    wherein a base area of a bottom component in a stack of the components comprises the assembly area; and
    wherein the components include a top component comprising at least one of the terminals, the at least one of the terminals comprising a top terminal, and at least part of the top terminal is bent downwards.

7. The surface-mounted component of claim 1, wherein at least one of the components comprises a capacitor, the capacitor comprising:
   an anode body;
   a housing around the anode body; and
   an anode contact comprising at least one of the terminals, the at least one of the terminals comprising soft-solderable material that protrudes from the anode body.

8. The surface-mounted component of claim 1, wherein the components define at least one housing, an electrical functional unit being inside the at least one housing and comprising connector elements defined by the terminals.

9. The surface-mounted component of claim 1, wherein the components are arranged horizontally to form a structure; and
   wherein a side face of the structure comprises the assembly surface.

10. The surface-mounted component of claim 1, wherein the external contact comprises at least two external contacts; and
    wherein the terminals are substantially parallel to the at least two external contacts at points where the terminals connect to the at least two external contacts.

11. The surface-mounted component of claim 1, wherein the components have different electrical functions and are stacked.

12. A method of manufacturing a surface-mountable component comprised of at least two external contacts that define an outer portion of the surface-mountable component, the method comprising:
    stacking, between the external contacts, components that have terminals; and
    connecting the terminals to the at least two external contacts, the terminals being connected to the at least two external contacts by spot welding, and an area of the at least two external contacts being kept free of spot welds.

13. The method of claim 12, wherein each external contact is L-shaped and comprises a leg, the leg defining a contact surface that interfaces to a terminal.

14. The method of claim 13, wherein at least part of each terminal is inside a component.

15. The method of claim 13, wherein the at least two external contacts and the terminals comprise separate parts of the surface-mountable component.

16. The method of claim 13, wherein at least part of each of the terminals extends along a side of the surface-mountable component.

17. The method of claim 13, wherein the components are stacked vertically; and
    wherein at least part of a terminal of a top component in the stack of components is bent downwards.

18. The method of claim 12, wherein at least one of the components comprises a capacitor, the capacitor comprising:
    an anode body;
    a housing around the anode body; and
    an anode contact comprising at least one of the terminals, the at least one of the terminals comprising comprised of a soft-solderable material that protrudes from the anode body.

19. The method of claim 12, wherein the components define at least one housing, an electrical functional unit being inside the at least one housing and comprising connector elements defined by the terminals.

* * * * *